(12) United States Patent
Kim et al.

(10) Patent No.: US 10,896,838 B2
(45) Date of Patent: Jan. 19, 2021

(54) ELECTROSTATIC CHUCKS AND SUBSTRATE PROCESSING APPARATUS INCLUDING THE SAME

(71) Applicant: Samsung Electronics Co., Ltd., Suwon-si (KR)

(72) Inventors: Minsung Kim, Suwon-si (KR); Myoung Soo Park, Seongnam-si (KR); Dougyong Sung, Seoul (KR); Yun-Kwang Jeon, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 116 days.

(21) Appl. No.: 16/248,328

(22) Filed: Jan. 15, 2019

(65) Prior Publication Data

US 2019/0148205 A1 May 16, 2019

Related U.S. Application Data

(63) Continuation of application No. 15/420,211, filed on Jan. 31, 2017, now Pat. No. 10,224,228.

(30) Foreign Application Priority Data

Mar. 15, 2016 (KR) ........................ 10-2016-0031014

(51) Int. Cl.
*H01L 21/683* (2006.01)
*H01J 37/32* (2006.01)
*H01L 21/67* (2006.01)

(52) U.S. Cl.
CPC ...... *H01L 21/6833* (2013.01); *H01J 37/3211* (2013.01); *H01J 37/3244* (2013.01); *H01J 37/32532* (2013.01); *H01J 37/32715* (2013.01); *H01J 37/32724* (2013.01); *H01L 21/67103* (2013.01); *H01L 21/67248* (2013.01); *H01J 2237/334* (2013.01)

(58) Field of Classification Search
CPC ......... H01L 21/67103; H01L 21/67248; H01L 21/6833; H01J 37/32532
USPC .................................................. 156/345.55
See application file for complete search history.

(56) References Cited

U.S. PATENT DOCUMENTS

| 5,751,537 | A | 5/1998 | Kumar et al. |
| 6,215,643 | B1 | 4/2001 | Nagasaki |
| 6,303,879 | B1 * | 10/2001 | Burkhart ............... C04B 37/026 174/261 |

(Continued)

FOREIGN PATENT DOCUMENTS

| JP | 2014-075525 A | 4/2014 |
| JP | 2014-175491 A | 9/2014 |

(Continued)

*Primary Examiner* — Charlee J. C. Bennett
(74) *Attorney, Agent, or Firm* — Muir Patent Law, PLLC

(57) ABSTRACT

An electrostatic chuck includes a base, a dielectric plate on the base, a chuck electrode in the dielectric plate, and a lower heater section including lower heaters in the dielectric plate between the chuck electrode and the base, and a lower ground electrode between the lower heaters and the base. The chuck further includes an upper heater section including upper heaters between the lower heaters and the chuck electrode, and a upper ground electrode between the upper heaters and the lower heaters, and a plurality of via contact electrodes connecting the upper ground electrode into the lower ground electrode.

19 Claims, 7 Drawing Sheets

(56) References Cited

U.S. PATENT DOCUMENTS

| | | | |
|---|---|---|---|
| 6,488,820 B1 * | 12/2002 | Burkhart | H01L 21/6831 |
| | | | 118/728 |
| 6,558,508 B1 * | 5/2003 | Kawakami | H01L 21/67103 |
| | | | 156/345.51 |
| 6,740,853 B1 | 5/2004 | Johnson et al. | |
| 6,916,401 B2 | 7/2005 | Long | |
| 7,848,075 B2 | 12/2010 | Nobori et al. | |
| 8,546,732 B2 | 10/2013 | Singh | |
| 8,637,794 B2 | 1/2014 | Singh et al. | |
| 8,884,194 B2 | 11/2014 | Singh et al. | |
| 9,012,243 B2 | 4/2015 | Kimura et al. | |
| 2002/0075624 A1 | 6/2002 | Wang et al. | |
| 2002/0135967 A1 | 9/2002 | Fuwa et al. | |
| 2003/0150563 A1 | 8/2003 | Kuibara et al. | |
| 2005/0016986 A1 * | 1/2005 | Ito | H05B 3/141 |
| | | | 219/444.1 |
| 2005/0213279 A1 | 9/2005 | Hayakawa | |
| 2006/0096972 A1 | 5/2006 | Nakamura | |
| 2006/0291132 A1 | 12/2006 | Kanno et al. | |
| 2009/0311430 A1 | 12/2009 | Ito | |
| 2013/0105457 A1 * | 5/2013 | Swanson | H05B 3/02 |
| | | | 219/209 |
| 2013/0224675 A1 | 8/2013 | Park | |
| 2014/0154819 A1 * | 6/2014 | Gaff | H01L 21/67109 |
| | | | 438/17 |
| 2014/0253900 A1 | 9/2014 | Cornelissen et al. | |
| 2015/0228513 A1 | 8/2015 | Parkhe | |
| 2015/0376783 A1 | 12/2015 | Hanamachi et al. | |
| 2016/0148828 A1 * | 5/2016 | Parkhe | H01L 21/68785 |
| | | | 361/234 |
| 2019/0013222 A1 * | 1/2019 | Kim | H01L 21/67103 |

FOREIGN PATENT DOCUMENTS

| | | |
|---|---|---|
| JP | 2015-035448 A | 2/2015 |
| JP | 5812279 B2 | 11/2015 |
| KR | 10-1042284 B1 | 6/2011 |

* cited by examiner

ELECTROSTATIC CHUCKS AND SUBSTRATE PROCESSING APPARATUS INCLUDING THE SAME

CROSS-REFERENCE TO RELATED APPLICATIONS

This U.S. nonprovisional patent application is a continuation application of U.S. patent application Ser. No. 15/420,211, filed Jan. 31, 2017, which claims priority under 35 U.S.C. § 119 to Korean Patent Application 10-2016-0031014 filed on Mar. 15, 2016, the entire contents of each which are hereby incorporated by reference.

BACKGROUND

The described exemplary embodiments relate to an apparatus for manufacturing a semiconductor device and, more particularly, to an electrostatic chuck for holding a substrate and a substrate processing apparatus.

Generally, semiconductor devices are manufactured by applying a plurality of unit processes. The unit processes may include a thin film deposition process, a lithography process, and an etch process. Plasma may mainly be employed to perform the thin film process and the etch process. The plasma may treat a substrate at high temperature. An electrostatic chuck may hold the high temperature substrate by an electrostatic voltage.

SUMMARY

The disclosed exemplary embodiments provide an electrostatic chuck and a substrate processing apparatus capable of heating a substrate to have an extremely stable or even temperature distribution.

According to exemplary embodiments, an electrostatic chuck may comprise: a base; a dielectric plate on the base; a chuck electrode in the dielectric plate; and a first heater section in the dielectric plate between the chuck electrode and the base. The first heater section may comprise: a plurality of first heaters that are separated from each other in a first direction; and a plurality of first upper plate electrodes between the plurality of first heaters and the base. The plurality of first upper plate electrodes may be separated from each other in the first direction and respectively connected to the plurality of first heaters.

According to exemplary embodiments, a substrate processing apparatus may comprise: a chamber; and an electrostatic chuck configured to hold a substrate in the chamber. The electrostatic chuck may comprise: a base; a dielectric plate on the base; a chuck electrode in the dielectric plate; and a first heater section in the dielectric plate between the chuck electrode and the base. The first heater section may comprise: a plurality of first heaters that are separated from each other in a first direction; and a plurality of first upper plate electrodes between the plurality of first heaters and the base. The plurality of first upper plate electrodes may be separated from each other in the first direction and respectively connected to the plurality of first heaters.

DETAILED DESCRIPTION

Figure 1:
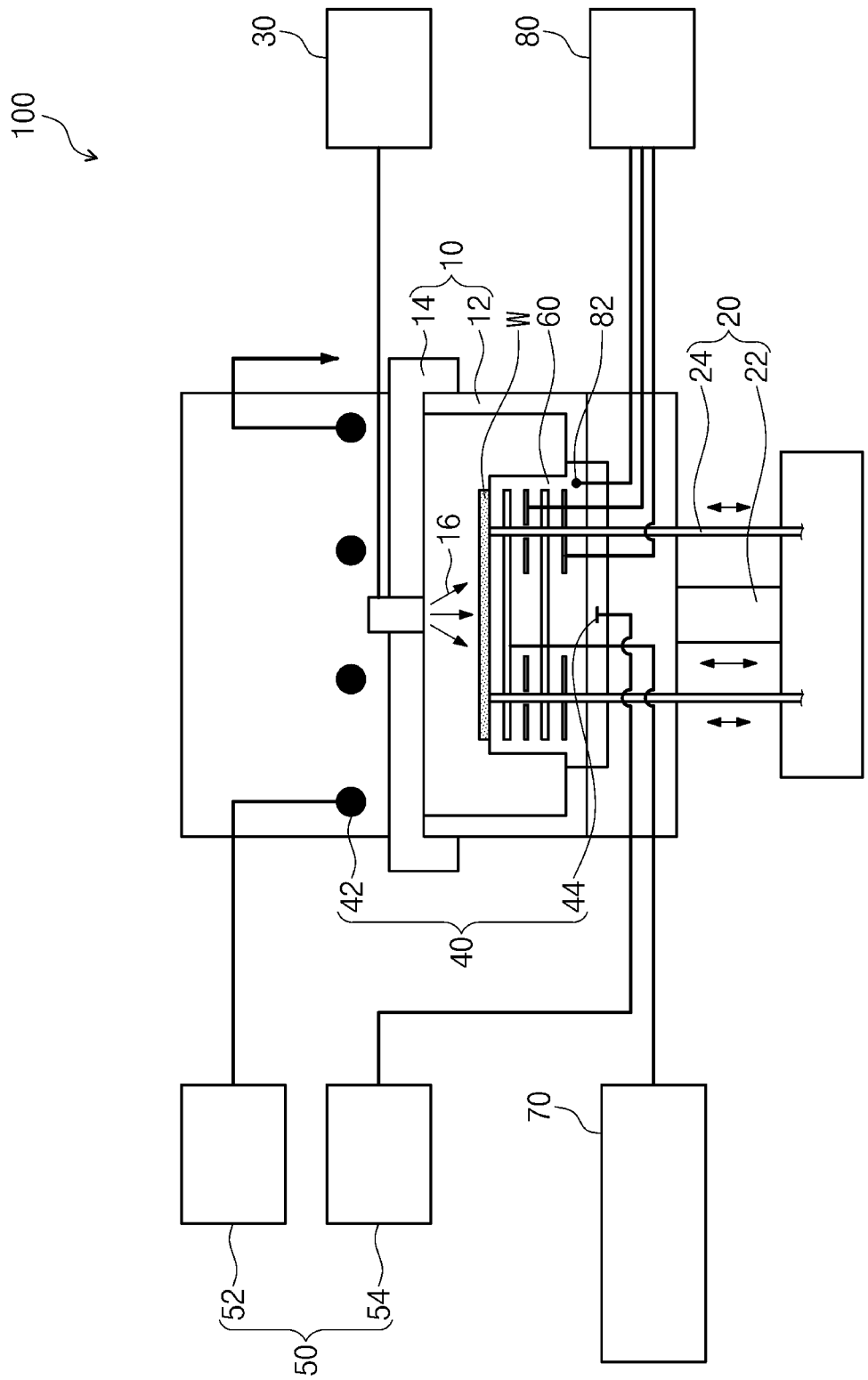
FIG. 1 shows a substrate processing apparatus according to exemplary embodiments.

The present disclosure now will be described more fully hereinafter with reference to the accompanying drawings, in which various exemplary embodiments are shown. The invention may, however, be embodied in many different forms and should not be construed as limited to the exemplary embodiments set forth herein. These example exemplary embodiments are just that—examples—and many implementations and variations are possible that do not require the details provided herein. It should also be emphasized that the disclosure provides details of alternative examples, but such listing of alternatives is not exhaustive. Furthermore, any consistency of detail between various exemplary embodiments should not be interpreted as requiring such detail—it is impracticable to list every possible variation for every feature described herein. The language of the claims should be referenced in determining the requirements of the invention.

Although the figures described herein may be referred to using language such as "one embodiment," or "certain embodiments," these figures, and their corresponding descriptions are not intended to be mutually exclusive from other figures or descriptions, unless the context so indicates. Therefore, certain aspects from certain figures may be the same as certain features in other figures, and/or certain figures may be different representations or different portions of a particular exemplary embodiment.

It will be understood that, although the terms first, second, third etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "connected" or "coupled" to or "on" another element, it can be directly connected or coupled to or on the other element or intervening elements may be present. In contrast, when an element is referred to as being "directly connected" or "directly coupled" to another element, or as "contacting" or "in contact with" another element, there are no intervening elements present. Other words used to describe the relationship between elements should be interpreted in a like fashion (e.g., "between" versus "directly between," "adjacent" versus "directly adjacent," etc.).

Embodiments described herein will be described referring to plan views and/or cross-sectional views by way of ideal schematic views. Accordingly, the exemplary views may be modified depending on manufacturing technologies and/or tolerances. Therefore, the disclosed exemplary implementations are not limited to those shown in the views, but include modifications in configuration formed on the basis of manufacturing processes. Therefore, regions exemplified in figures may have schematic properties, and shapes of regions shown in figures may exemplify specific shapes of regions of elements to which aspects of the invention are not limited.

Spatially relative terms, such as "beneath," "below," "lower," "above," "upper" and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

Also these spatially relative terms such as "above" and "below" as used herein have their ordinary broad meanings—for example element A can be above element B even if when looking down on the two elements there is no overlap between them (just as something in the sky is generally above something on the ground, even if it is not directly above).

Components described as thermally connected or in thermal communication are arranged such that heat will follow a path between the components to allow the heat to transfer from the first component to the second component. Simply because two components are part of the same device or package does not make them thermally connected. In general, components which are heat-conductive and directly connected to other heat-conductive or heat-generating components (or connected to those components through intermediate heat-conductive components or in such close proximity as to permit a substantial transfer of heat) will be described as thermally connected to those components, or in thermal communication with those components. On the contrary, two components with heat-insulative materials therebetween, which materials significantly prevent heat transfer between the two components, or only allow for incidental heat transfer, are not described as thermally connected or in thermal communication with each other. The terms "heat-conductive" or "thermally-conductive" do not apply to a particular material simply because it provides incidental heat conduction, but are intended to refer to materials that are typically known as good heat conductors or known to have utility for transferring heat, or components having similar heat conducting properties as those materials.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

FIG. 1 shows a substrate processing apparatus 100 according to exemplary embodiments.

As shown in FIG. 1, the substrate processing apparatus 100 may include an inductively coupled plasma (ICP) etching apparatus. Alternatively, the substrate processing apparatus 100 may include a capacitively coupled plasma (CCP) etching apparatus, a mechanical vapor deposition apparatus, or a chemical vapor deposition apparatus. In an exemplary embodiment, the substrate processing apparatus 100 may include a chamber 10, a lift unit 20, a gas supply 30, a radio frequency (RF) electrode unit 40, a RF power supply unit 50, an electrostatic chuck 60, an electrostatic voltage supply 70, and a temperature controller 80. The substrate W may be provided in the chamber 10. The lift unit 20 may be configured to move the chamber 10 and the substrate W in the chamber 10. The lift unit 20 may be configured to move the substrate relative to chamber 10. The gas supply 30 may provide a reactive gas 16 into the chamber 10. The RF electrode unit 40 may use RF power (not shown) to excite the reactive gas 16 into a plasma state. The RF power supply unit 50 may provide the RF electrode unit 40 with RF power. The electrostatic chuck 60 may hold the substrate W by an electrostatic voltage. The electrostatic voltage supply 70 may provide the electrostatic chuck 60 with the electrostatic voltage. The temperature controller 80 may monitor and control a temperature of the electrostatic chuck 60.

The chamber 10 may provide the substrate W with a space isolated from the outside atmosphere. For example, the chamber 10 may have a pressure of about $10^{-3}$ Torr. In an exemplary embodiment, the chamber 10 may include a bottom housing 12 and a top housing 14. The substrate W may be provided in the bottom housing 12. The top housing 14 may be disposed on the bottom housing 12.

The lift unit 20 may be placed under the bottom housing 12. The lift unit 20 may be configured to move the bottom housing 12. The top housing 14 may be relatively fixed to the bottom housing 12. Alternatively, the bottom housing 12 may be fixed and the top housing 14 may be moved by the lift unit 20 in a vertical direction of the substrate W. In an exemplary embodiment, the lift unit 20 may include a lift cylinder 22 and lift pins 24. The lift cylinder 22 may drive the bottom housing 12 to move up and down. Alternatively, the lift cylinder 22 may drive the top housing 12 to move up and down. When the bottom housing 12 descends and is separated from the top housing 14, a robot (not shown) may put the substrate W in place on the lift pins 24 in the bottom housing 12. The lift pins 24 may provide an up-and-down movement to the substrate W in the bottom housing 12. When the top housing 14 is combined with the bottom housing 12 due to its ascent toward the top housing 14, a plasma process may be started. When a manufacturing process for the substrate W is terminated, the bottom housing 12 may move downward and the lift pins 24 may drive the substrate W to move upward. The substrate W may then be released from the chamber 10.

The gas supply 30 may be connected to the top housing 14. For example, the gas supply 30 may provide the chamber 10 with the reactive gas 16 such as $SF_6$, HF, $CH_3$, $CH_4$, or $N_2$.

The RF electrode unit 40 may be installed at both the top housing 14 and the bottom housing 12. In an exemplary embodiment, the RF electrode unit 40 may include an antenna electrode 42 and a bias electrode 44. The antenna electrode 42 may be placed on the top housing 14. The bias electrode 44 may be placed in the electrostatic chuck 60 of the bottom housing 12.

The RF power supply unit 50 may be installed outside the chamber 10. In an exemplary embodiment, the RF power supply unit 50 may include a source power supply 52 and a bias power supply 54. The source power supply 52 may provide the antenna electrode 42 with a source of RF power. The RF power may excite the reactive gas 16 into a plasma state. The bias power supply 54 may provide the bias electrode 44 with a bias RF power. The bias RF power may concentrate the reactive gas 16 in the plasma state onto the substrate W. The substrate W may be processed with the reactive gas 16. For example, the substrate W may be etched.

The electrostatic chuck 60 may be placed in the bottom housing 12. The lift pins 24 may be provided to pass through the floor of the bottom housing 12 and the electrostatic chuck 60. When the lift pins 24 moves downward, the substrate W may be loaded on the electrostatic chuck 60. When the lift pins 24 moves upward, the substrate W may be maintained on the electrostatic chuck 60, by electrostatic forces.

More particularly, the electrostatic voltage supply 70 may be connected to the electrostatic chuck 60 which may provide the electrostatic chuck 60 with an electrostatic voltage of about ±2500V. The electrostatic voltage may hold the substrate W onto the electrostatic chuck 60 based on the Johnsen-Rahbek effect.

The temperature controller 80 may be connected to the electrostatic chuck 60. A temperature sensor 82 may be installed within the electrostatic chuck 60. The temperature controller 80 may use the temperature sensor 82 to detect the temperature of the electrostatic chuck 60. The temperature controller 80 may also heat the electrostatic chuck 60 and the substrate W.

Figure 2:
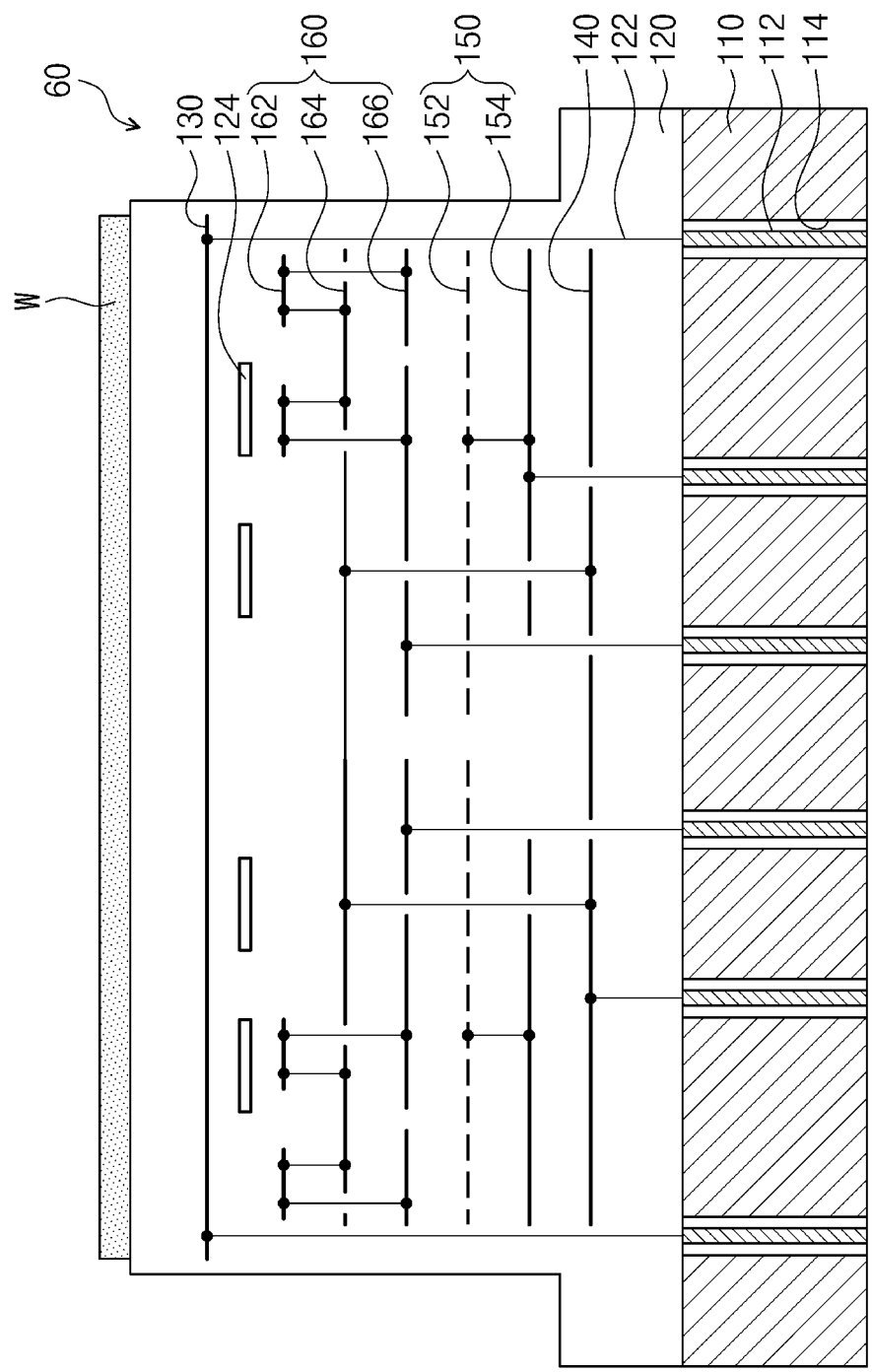
FIGS. 2 and 3 show an example of the electrostatic chuck of FIG. 1.
Figure 3:
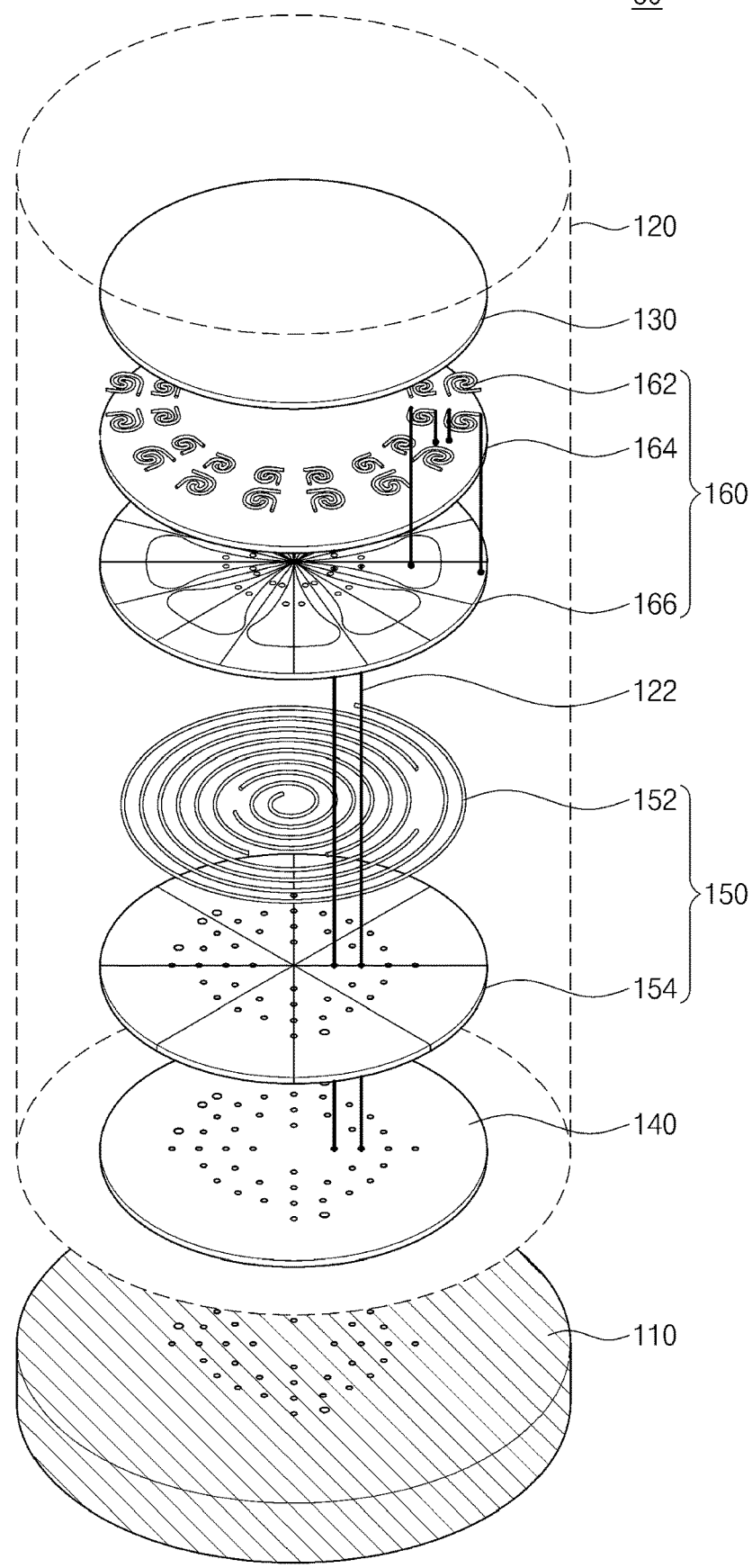

FIGS. 2 and 3 show an example of the electrostatic chuck 60 of FIG. 1 wherein the electrostatic chuck 60 may include a metal base 110, a dielectric plate 120, a chuck electrode 130, a lower ground plate electrode 140, a lower heater section 150, and an upper heater section 160.

The metal base 110 may include an aluminum disc plate. The metal base 110 may correspond to the bias electrode 44 of FIG. 1 and may be connected to the bias power supply 54. The metal base 110 may include a plurality of holes 114 therein. The plurality of holes 114 may penetrate the metal base 110. A plurality of connectors 112 may be respectively provided in each of the holes 114. The connectors 112 may penetrate the metal base 110 and be insulated therefrom. The connectors 112 may be respectively connected to the chuck electrode 130, the lower ground plate 140, the lower heater section 150, and the upper heater section 160 on the metal base 110. For example, the connectors 112 may be respectively connected to the chuck electrode 130, the lower ground plate electrode 140, the lower heater section 150, and the upper heater section 160 by a plurality of via contact electrodes 122 in the dielectric plate 120. Chuck electrode 130 may be connected to electrostatic voltage supply 70.

The dielectric plate 120 may be placed on the metal base 110. For example, the dielectric plate 120 may have a diameter identical to a diameter of the metal base 110. Alternatively, the diameter of the dielectric plate 120 may be less than the diameter of the metal base 110. For example, an adhesive or bolts may be provided to combine the metal base 110 with the dielectric plate 120. The dielectric plate 120 may include an aluminum oxide ($Al_2O_3$) ceramic. The dielectric plate 120 may include a plurality of cooling gas line holes 124 therein. The cooling gas line holes 124 may be provided to introduce a cooling gas (not shown) such as helium into under the substrate W. The cooling gas may cool the substrate W. The dielectric plate 120 and the metal base 110 may have thermal expansion coefficients different from each other. For example, the thermal expansion coefficient may be larger for the metal base 110 than for the dielectric plate 120. The difference of the thermal expansion coefficient may electrically disconnect the connectors 112 from the via contact electrodes 122. The connectors 112 may be damaged by thermal expansion differences of the metal base 110 and the dielectric plate 120.

Figure 4:
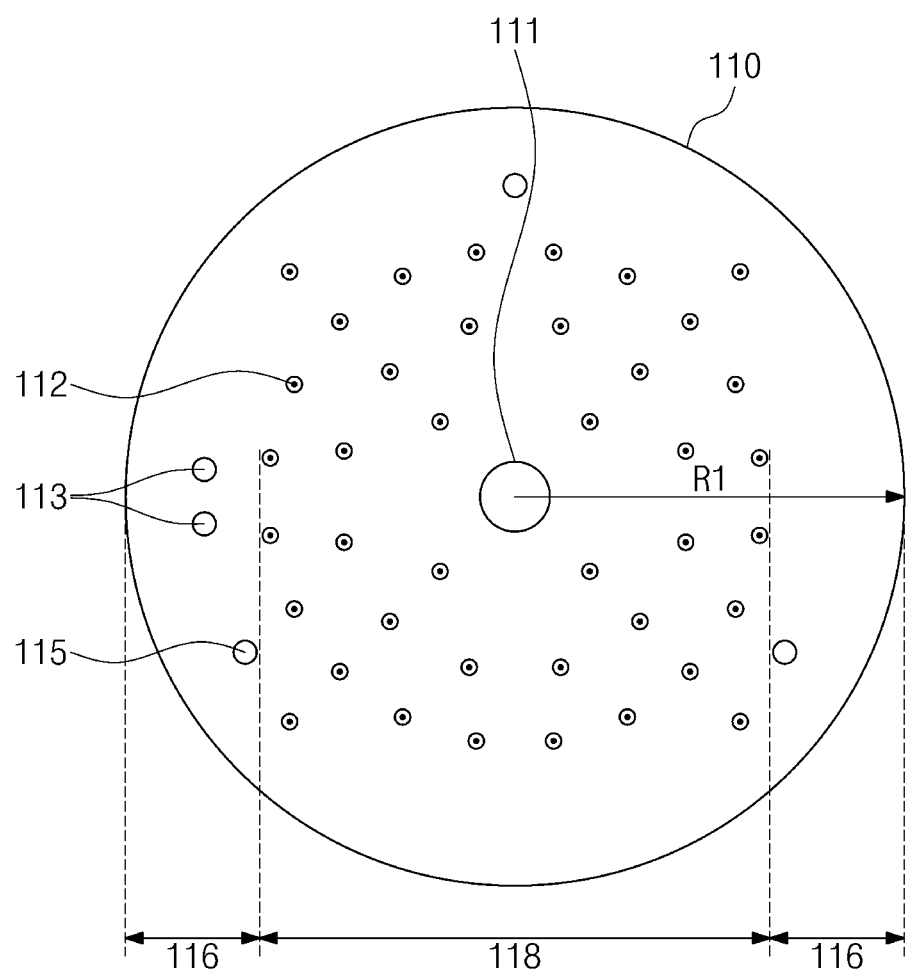
FIG. 4 shows an example of the metal base of FIG. 2.

FIG. 4 shows an example of the metal base 110 of FIG. 2 in which the connectors 112 may be mainly disposed at a central region 118 of the metal base 110. A plurality of refrigerant gas holes 113 and a plurality of lift pin holes 115 may be mainly disposed at an edge region 116 of the metal base 110. A bias RF power connection terminal 111 may be disposed at a center of the metal base 110. The thermal expansion of the metal base 110 may affect more severely the connectors 112 adjacent to the edge region 116 than the connectors 112 adjacent to the bias RF power connection terminal 111. The connectors 112 closer to the center of the metal base may shift in a shorter radius direction R1 of the metal base 110 than the connectors 112 adjacent to the edge region 116. Accordingly, the aggregation of the connectors 112 at the central region 118 may prevent the connectors 112 from damage and electrical disconnection with the via contact electrodes 122 caused by the difference of the thermal expansion coefficient between the metal base 110 and the dielectric plate 120.

As shown in FIGS. 2 and 3, the chuck electrode 130 may be disposed within the dielectric plate 120. For example, the chuck electrode 130 may include a metal disc. The chuck electrode 130 may have a diameter less than the diameter of the dielectric plate 120. The via contact electrodes 122 may connect the chuck electrode 130 to the connectors 112.

The lower ground plate electrode 140 may be disposed in the dielectric plate 120 between the chuck electrode 130 and the metal base 110. For example, the lower ground plate electrode 140 may include a disc of metal such as tungsten. The via contact electrodes 122 may connect the lower ground plate electrode 140 to the connectors 112.

The lower heater section 150 may be disposed in the dielectric plate 120 between the chuck electrode 130 and the metal base 110. The lower heater section 150 may have a diameter less than the diameter of the dielectric plate 120. For example, the lower heater section 150 may include lower heaters 152 and lower plate electrodes 154.

The lower heaters 152 may be concentrically shaped macro heaters. For example, the lower heaters 152 may include an alloy of nickel and chromium. The via contact electrodes 122 may connect the lower heaters 152 to the lower plate electrodes 154.

The lower plate electrodes 154 may be disposed between the lower heaters 152 and the lower ground plate electrode 140. The via contact electrodes 122 may connect the lower plate electrodes 154 to the connectors 112. The via contact electrodes 122 and the lower plate electrodes 154 may serve as electrical interconnection lines between the connectors 112 and the lower heaters 152. The via contact electrodes 122 may be vertical interconnection lines, and the lower plate electrodes 154 may be horizontal interconnection lines. The via contact electrodes 122 and the lower plate electrodes 154 may include tungsten.

Figure 5:
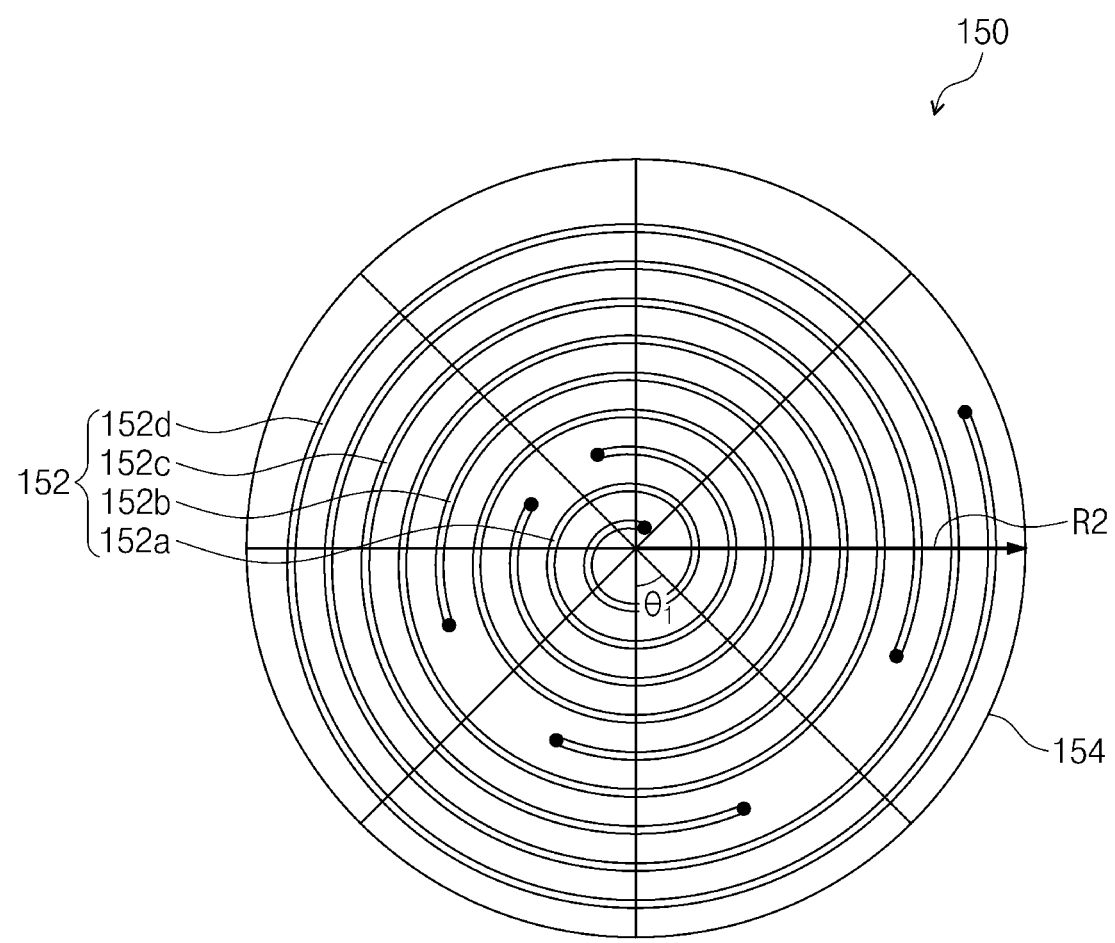
FIG. 5 shows an example of the lower heater section of FIG. 2.

FIG. 5 shows an example of the lower heater section 150 of FIG. 2 in which the lower heaters 152 of the lower heater section 150 may include first to fourth ring heaters 152a to 152d. The first to fourth ring heaters 152a to 152d may be separated from each other in a radius direction R2 of the dielectric plate 120. The first to fourth ring heaters 152a to 152d may respectively have radii that are sequentially increased. For example, the first ring heater 152a may be disposed within the second ring heater 152b. The second ring heater 152b may be disposed within the third ring heater 152c. The third ring heater 152c may be disposed within the fourth ring heater 152d. An additional ring heater (not shown) may further be disposed outside the fourth ring heater 152d.

The lower plate electrodes 154 may be separated from each other in a direction crossing the first to fourth ring heaters 152a to 152d. In an exemplary embodiment, the lower plate electrodes 154 may be separated from each other in an azimuth direction. Each of the lower plate electrodes 154 may be arc plate electrode. For example, the lower plate electrodes 154 may include arc-shaped plate electrodes that are separated into eight segments. Each of the lower plate electrodes 154 may have an azimuth angle $\theta_1$ of about 45° at its corner. Each of the first to fourth ring heaters 152a to 152d may be connected to the plurality of the lower plate electrodes 154. The lower plate electrodes 154 may minimize or reduce heat generation from electrical horizontal interconnection lines of the first to fourth ring heaters 152a to 152d.

As shown in FIGS. 2 and 3, the upper heater section 160 may be disposed between the lower heaters 152 and the chuck electrode 130. The upper heater section 160 may have a diameter substantially the same as the diameter of the lower heater section 150. In an exemplary embodiment, the upper heater section 160 may include upper heaters 162, an upper ground plate electrode 164, and upper plate electrodes 166.

The upper heaters 162 may be disposed at an edge region of the dielectric plate 120. Alternatively, the upper heaters 162 may be disposed at a center of the dielectric plate 120. The upper heaters 162 may be micro heaters whose sizes are less than those of the lower heaters 152. The upper heaters 162 may include an alloy of nickel and chromium.

The upper ground plate electrode 164 may be disposed between the upper heaters 162 and the lower heaters 152. The upper heaters 162 may be commonly connected to the upper ground plate electrode 164 through the via contact electrodes 122. The via contact electrodes 122 may connect the upper ground plate electrode 164 to the lower ground plate electrode 140. The via contact electrodes 122 may also connect the lower ground plate electrode 140 to the connectors 112.

The upper plate electrodes 166 may be disposed between the upper ground plate electrode 164 and the lower heaters 152. The upper heaters 162 may be individually connected to the upper plate electrodes 166 through the via contact electrodes 122. The via contact electrodes 122 may connect the upper plate electrodes 166 to the connectors 112. The via contact electrodes 122, the lower ground plate electrode 140, the upper ground plate electrode 164, and the upper plate electrodes 166 may be used as electrical interconnection paths between the upper heaters 162 and the connectors 112. The lower ground plate electrode 140, the upper ground plate electrode 164, and the upper plate electrodes 166 may minimize or reduce heat generation from electrical horizontal interconnection lines of the upper heaters 162.

Figure 6:
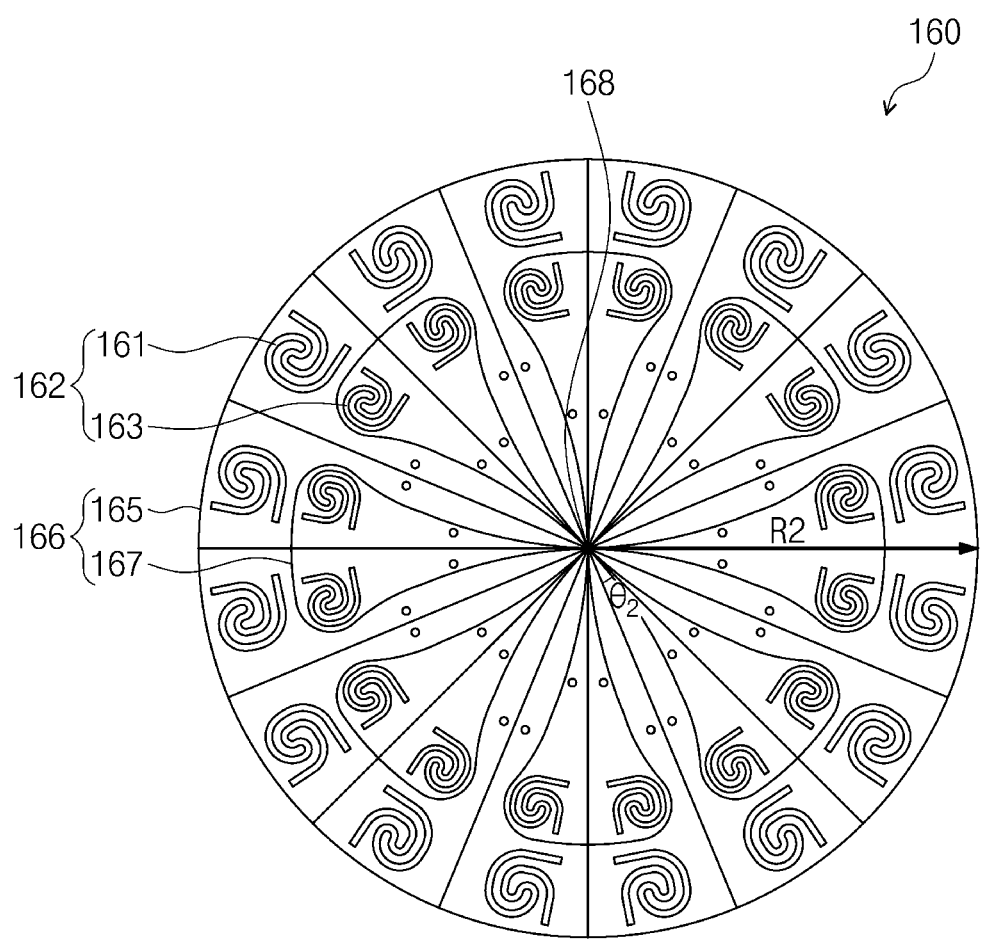
FIG. 6 shows an example of the upper heater section of FIG. 2.

FIG. 6 shows an example of the upper heater section 160 of FIG. 2 in which the upper heaters 162 may be separated from each other in an azimuth direction. In an exemplary embodiment, each of the upper heaters 162 may include an outer arc heater 161 and an inner arc heater 163. The outer and inner arc heaters 161 and 163 may be separated from each other in the radius direction R2 of the dielectric plate 120. The outer arc heaters 161 may be disposed on circumferences of the inner arc heaters 163. The inner arc heaters 163 may be disposed closer to a vertex 168 than the outer arc heaters 161. The outer arc heater 161 may have an area greater than that of the inner arc heater 163. The outer arc heaters 161 may be arranged to be the same in number as the inner arc heaters 163. For example, ones of the outer and inner arc heaters 161 and 163 may consist of sixteen pairs of arc heaters. Alternatively, ones of the outer and inner arc heaters 161 and 163 may consist of 2n pairs of arc heaters. The "n" may be a natural number.

As shown in FIGS. 2 and 6, the outer and inner arc heaters 161 and 163 may separately heat the substrate W along the radius direction R2 and the azimuth direction. Accordingly, the outer and inner arc heaters 161 and 163 may heat the substrate W at a stable or even temperature distribution.

As shown in FIG. 6, the upper plate electrodes 166 may be arranged to have a one-to-one match with the upper heaters 162. The upper heaters 162 may be positioned to overlap the upper plate electrodes 166. For example, each of the upper plate electrodes 166 may have an arc shape having the vertex 168. The upper plate electrodes 166 may be separated from each other in the azimuth direction. In an exemplary embodiment, each of the upper plate electrodes 166 may include an outer arc plate electrode 165 and an inner arc plate electrode 167.

The outer arc plate electrodes 165 and the inner arc plate electrodes 167 may be separated from each other in the azimuth direction. The outer arc plate electrodes 165 may be arranged to have the same number as the inner arc plate electrodes 167. For example, ones of the outer and inner arc plate electrodes 165 and 167 may consist of sixteen pairs of arc plate electrodes. The outer and inner arc plate electrodes 165 and 167 may be disposed in the same second azimuth angle $\theta_2$. For example, the second azimuth angle $\theta_2$ may be about 22.5°. Alternatively, each of the outer arc plate electrodes 165 may have an azimuth angle half the second azimuth angle $\theta_2$, and likewise each of the inner arc plate electrodes 167 may have an azimuth angle half the second azimuth angle $\theta_2$.

The inner arc plate electrodes 167 may be disposed closer to the vertex 168 than the outer arc plate electrodes 165 which may extend from the vertex 168 and be disposed outside at least portions of the inner arc plate electrodes 167. A pair of the inner arc plate electrodes 167 may be placed between a pair of the outer arc plate electrodes 165. Each of the outer arc plate electrodes 165 may have an outer diameter greater than that of each of the inner arc plate electrodes 167. The outer arc plate electrode 165 may be wider than the inner arc plate electrode 167.

The outer arc heaters 161 may be placed on the outer arc plate electrodes 165. For example, the outer arc heaters 161 may be disposed to overlap the outer arc plate electrodes 165. The inner arc heater 163 may be placed on the inner arc plate electrodes 167. The inner arc heater 163 may be disposed to overlap the inner arc plate electrodes 167. Alternatively, the inner arc heaters 163 may be placed on the outer arc plate electrodes 165 respectively. The outer arc plate electrodes 165 and the inner arc plate electrodes 167 may minimize or reduce heat generation from electrical horizontal interconnection lines of the outer arc heaters 161 and the inner arc heaters 163, respectively.

The upper heaters 162 may further include arc heaters (not shown) within the inner arc heaters 163. The arc heaters may be separated from each other in the azimuth direction and the radius direction R2. The upper plate electrodes 166 may further include arc plate electrodes (not shown) disposed within at least portions of the inner arc plate electrodes 167. The arc plate electrodes may be separated from each other in the azimuth direction. The arc heaters may be connected to the arc plate electrodes in a one-to-one correspondence relationship. The arc heaters may heat the substrate W on the dielectric plate 120 at a stable or even temperature distribution. The arc plate electrodes may minimize or reduce heat generation from electrical horizontal interconnection lines of the arc heaters.

Figure 7:
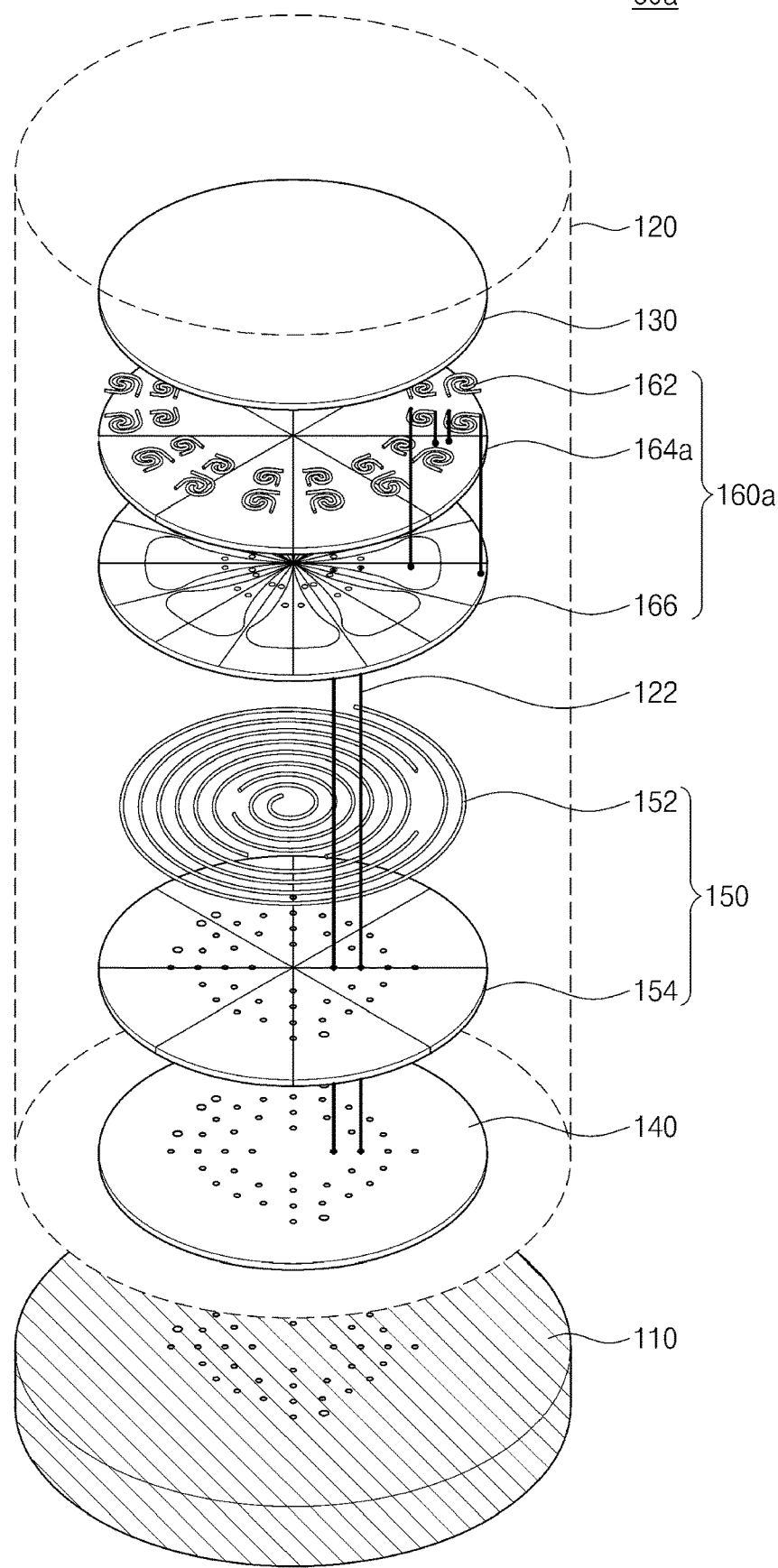
FIG. 7 shows an example of the electrostatic chuck of FIG. 1.

FIG. 7 show an example of the electrostatic chuck 60 of FIG. 1 in which the electrostatic chuck 60a may include an upper heater section 160a having upper ground plate electrodes 164a. The metal base 110, the dielectric plate 120, the chuck electrode 130, the lower ground plate electrode 140, and the lower heater section 150 are disclosed in FIG. 3. In an exemplary embodiment, the upper ground plate electrodes 164a may have the same shape as a shape of the lower plate electrodes 154. For example, the upper ground plate electrodes 164a may include sector-shaped plate electrodes. The upper ground plate electrodes 164a are eight to sixteen. Each of upper ground plate electrodes 164a may be connected to four upper heaters 162.

According to exemplary embodiments of the present inventive concept, the electrostatic chuck may include the plate electrodes and the heaters. Ones of the plate electrodes and the heaters may be separated from each other in the radius direction of the dielectric plate and in the azimuth direction. The separated heaters may heat the substrate on the dielectric plate at a stable or even temperature distribution. The separated plate electrodes may minimize or reduce electrical interconnection lines of the heaters.

Although the present invention has been described in connection with exemplary embodiments illustrated in the accompanying drawings, the inventive concepts disclosed herein are not limited thereto. It will be apparent to those skilled in the art that various substitution, modifications and changes may be made to the exemplary embodiments without departing from the scope and spirit of the inventions set forth in the following claims.

We claim:

1. An electrostatic chuck comprising:
   a base;
   a dielectric plate on the base;
   a chuck electrode in the dielectric plate; and
   a lower heater section including lower heaters in the dielectric plate between the chuck electrode and the base, and a lower ground electrode between the lower heaters and the base;
   an upper heater section including upper heaters between the lower heaters and the chuck electrode, and an upper ground electrode between the upper heaters and the lower heaters; and
   a plurality of via contact electrodes connecting the upper ground electrode to the lower ground electrode,
   wherein the lower heater section further comprises lower plate electrodes between the lower heaters and the lower ground electrode, and
   wherein the upper heater section further comprises upper plate electrodes between the upper ground electrode and the lower heaters.

2. The electrostatic chuck of claim 1, wherein the plurality of via contact electrodes connect the lower ground electrode the lower heaters and the upper ground electrode to the upper heaters.

3. The electrostatic chuck of claim 1, wherein the plurality of via contact electrodes connect the lower plate electrodes to the lower heaters and the upper plate electrodes to the upper heaters.

4. The electrostatic chuck of claim 1, wherein the upper ground electrode has a shape similar to a shape of the lower plate electrodes.

5. The electrostatic chuck of claim 1, wherein each of the lower plate electrodes has an azimuthal angle of 2 π/n, wherein n is a number of the lower heaters.

6. The electrostatic chuck of claim 1, wherein the upper plate electrodes form a circular plate, and wherein each of the upper plate electrodes comprises:
   a pie-shaped sector having a first azimuthal angle and a vertex corresponding to a center of the circular plate; and
   an inner sector formed inside the pie-shaped sector to extend from the vertex toward an outer circumference of the circular plate in a radial direction of the base, wherein the inner sector has a smaller azimuthal width and a smaller radial length than the pie-shaped sector.

7. The electrostatic chuck of claim 6, wherein each of the upper heaters comprises:
   an outer arc heater disposed on and vertically overlapping a respective pie-shaped sector and outside of a respective inner sector from a top-down view, the outer arc heater electrically connected to the pie-shaped sector; and
   an inner arc heater disposed on and vertically overlapping the inner sector, and electrically connected to the inner sector.

8. The electrostatic chuck of claim 1, wherein each of the lower heaters is larger than each of the upper heaters.

9. The electrostatic chuck of claim 1, wherein the lower ground electrode and the upper ground electrode are metal discs.

10. An electrostatic chuck comprising:
    a base having an edge region and a center region inside the edge region;
    a plurality of connectors in the center region;
    a dielectric plate on the base and the plurality of connectors;
    a chuck electrode disposed in the dielectric plate and connected to the plurality of connectors;
    a lower heater section including a lower heater between the chuck electrode and the plurality of connectors, a lower ground electrode between the lower heater and the plurality of connectors, and a lower plate electrode between the lower ground electrode and the lower heater; and
    an upper heater section including an upper heater between the lower heater and the chuck electrode, an upper plate electrode between the upper heater and the lower heater, and an upper ground electrode between the upper plate electrode and the upper heater,
    wherein the lower ground electrode is connected to the upper ground electrode.

11. The electrostatic chuck of claim 10, wherein the base has a coolant gas hole and a lift pin hole.

12. The electrostatic chuck of claim 11, wherein the dielectric plate has a gas line hole disposed on the chuck electrode, the gas line hole connected to the coolant gas hole.

13. The electrostatic chuck of claim 10, wherein the plurality of connectors connect to the chuck electrode, the first lower ground electrode, the lower plate electrode, and the upper plate electrode.

14. The electrostatic chuck of claim 13, further comprising a plurality of via contacts,
wherein the plurality of via contacts comprise:
a plurality of lower signal via contact electrodes connecting the lower plate electrode and the upper plate electrode to the plurality of connectors;
a plurality of upper signal via contact electrodes connecting the lower heater and the upper heater to the lower plate electrode and the upper plate electrode respectively;
a lower ground via contact electrode connecting the lower ground electrode to one of the plurality of connectors; and
an upper ground via contact electrode connecting the upper ground electrode to the lower ground electrode.

15. A substrate processing apparatus, comprising:
a chamber; and
an electrostatic chuck configured to hold a substrate in the chamber,
wherein the electrostatic chuck comprises:
a base;
a dielectric plate on the base;
a chuck electrode in the dielectric plate; and
a lower heater section including lower heaters in the dielectric plate between the chuck electrode and the base, and a lower ground electrode between the lower heaters and the base;
an upper heater section including upper heaters between the lower heaters and the chuck electrode, and an upper ground electrode between the upper heaters and the lower heaters; and
a via contact electrode connecting the upper ground electrode to the lower ground electrode,
wherein the lower heater section further comprises lower plate electrodes between the lower heaters and the lower ground electrode, and
wherein the upper heater section further comprises upper plate electrodes between the upper ground electrode and the lower heaters.

16. The substrate processing apparatus of claim 15, further comprising:
a temperature sensor disposed in the electrostatic chuck; and
a temperature controller that receives a detection signal from the temperature sensor to control a temperature of the lower heater section and the upper heater section.

17. The substrate processing apparatus of claim 16, wherein the electrostatic chuck further comprises a plurality of connectors disposed at a central region of the base.

18. The substrate processing apparatus of claim 17, wherein the via contact electrode connects the lower ground electrode to one of the plurality of connectors.

19. The substrate processing apparatus of claim 15, further comprising:
a gas supply configured to provide a gas to the substrate in the chamber; and
a radio frequency electrode unit including a bias electrode that provides a radio frequency power to the gas,
wherein the base is the bias electrode.

* * * * *